(12) United States Patent
Hu (10) Patent No.: US 10,141,198 B2
(45) Date of Patent: Nov. 27, 2018

(54) ELECTRONIC PACKAGE AND MANUFACTURING METHOD THEREOF

(71) Applicant: Dyi-Chung Hu, Hsinchu (TW)

(72) Inventor: Dyi-Chung Hu, Hsinchu (TW)

(*) Notice: Subject to any disclaimer, the term of this patent is extended or adjusted under 35 U.S.C. 154(b) by 0 days.

(21) Appl. No.: 15/643,481

(22) Filed: Jul. 7, 2017

(65) Prior Publication Data

US 2018/0012774 A1 Jan. 11, 2018

Related U.S. Application Data

(60) Provisional application No. 62/359,755, filed on Jul. 8, 2016.

(51) Int. Cl.

| | |
|---|---|
| H01L 23/49 | (2006.01) |
| H01L 21/48 | (2006.01) |
| H01L 21/56 | (2006.01) |
| H01L 21/683 | (2006.01) |
| H01L 23/498 | (2006.01) |
| H01L 23/00 | (2006.01) |
| H01L 25/065 | (2006.01) |
| H01L 25/00 | (2006.01) |

(52) U.S. Cl.
CPC ........ *H01L 21/4853* (2013.01); *H01L 21/481* (2013.01); *H01L 21/4857* (2013.01); *H01L 21/561* (2013.01); *H01L 21/568* (2013.01); *H01L 21/6835* (2013.01); *H01L 23/49816* (2013.01); *H01L 23/49822* (2013.01); *H01L 23/49838* (2013.01); *H01L 24/16* (2013.01); *H01L 24/97* (2013.01); *H01L 25/0655* (2013.01); *H01L 25/50* (2013.01); *H01L 2221/68345* (2013.01); *H01L 2221/68359* (2013.01); *H01L 2224/16227* (2013.01); *H01L 2224/95001* (2013.01)

(58) Field of Classification Search
CPC .......... H01L 21/4853; H01L 23/49816; H01L 23/49822; H01L 23/49838; H01L 25/0655
USPC .................................................. 257/770–774
See application file for complete search history.

(56) References Cited

U.S. PATENT DOCUMENTS

| | | | |
|---|---|---|---|
| 9,673,148 B2 | 6/2017 | Hu | |
| 2011/0169150 A1* | 7/2011 | Su | H01L 21/4857 257/675 |
| 2012/0153445 A1* | 6/2012 | Son | H01L 23/3128 257/668 |
| 2013/0187269 A1* | 7/2013 | Lin | H01L 24/81 257/737 |

(Continued)

*Primary Examiner* — Sheikh Maruf
(74) *Attorney, Agent, or Firm* — JCIPRNET (57) ABSTRACT

An electronic package including a middle patterned conductive layer, a first redistribution circuitry disposed on a first surface of the middle patterned conductive layer and a second redistribution circuitry disposed on a second surface of the middle patterned conductive layer is provided. The middle patterned conductive layer has a plurality of middle conductive pads. The first redistribution circuitry includes a first patterned conductive layer having a plurality of first conductive elements. Each of the first conductive elements has a first conductive pad and a first conductive via that form a T-shaped section. The second redistribution circuitry includes a second patterned conductive layer having a plurality of second conductive elements. Each of the second conductive elements has a second conductive pad and a second conductive via that form an inversed T-shaped section.

11 Claims, 9 Drawing Sheets

(56) References Cited

U.S. PATENT DOCUMENTS

| | | | |
|---|---|---|---|
| 2014/0008814 A1* | 1/2014 | Chen | H01L 23/481 |
| | | | 257/774 |
| 2014/0077369 A1* | 3/2014 | Liang | H01L 23/49827 |
| | | | 257/738 |
| 2014/0091428 A1* | 4/2014 | Hossain | H01L 23/13 |
| | | | 257/532 |
| 2014/0102777 A1 | 4/2014 | Chen et al. | |
| 2014/0252599 A1* | 9/2014 | Kwon | H01L 21/76802 |
| | | | 257/737 |
| 2016/0064309 A1* | 3/2016 | Su | H01L 21/565 |
| | | | 257/773 |
| 2016/0126173 A1* | 5/2016 | Kim | H01L 23/498 |
| | | | 257/738 |
| 2016/0351543 A1* | 12/2016 | Ryu | H01L 25/04 |
| 2017/0207153 A1* | 7/2017 | Chang Chien | H01L 24/81 |
| 2017/0352613 A1* | 12/2017 | Baloglu | H01L 21/4853 |
| 2018/0005931 A1* | 1/2018 | Chen | H01L 21/4853 |

* cited by examiner

ELECTRONIC PACKAGE AND MANUFACTURING METHOD THEREOF

CROSS REFERENCE TO RELATED APPLICATION

This application claims the priority benefit of U.S. provisional application Ser. No. 62/359,755, filed on Jul. 8, 2016. The entirety of the above-mentioned patent application is hereby incorporated by reference herein and made a part of specification.

BACKGROUND OF THE INVENTION

1. Field of the Invention

The present invention relates to a package structure, especially relates to an electronic package without having any interposer therein.

2. Description of Related Art

Conventionally, taking U.S. patent publication number 2014/0102777 for example, a chip package uses a rigid interposer as a package support. For example, a semiconductor chip is mounted onto the top electrode pads of the top redistribution layer through conductive bumps, and a solder ball can be disposed on each of the bottom conductive pads of the circuit built-up structure configured on bottom of the interposer. A molding layer is formed to encapsulate the interposer. At least one conductive through via penetrates the interposer. An insulating protection layer is formed on the bottom circuit built-up structure to expose the conductive pad.

The disadvantage for such chip package is that it uses a rigid interposer which makes the chip package thicker. Nowadays, a thinner chip package with high-density and high-speed package is pursued for meeting the requirement of various thin package applications.

SUMMARY OF THE INVENTION

The invention provides an electronic package and a manufacturing method thereof, which effectively reduces the size thereof.

The invention provides an electronic package including a middle patterned conductive layer, a first redistribution circuitry and a second redistribution circuitry. The middle patterned conductive layer has a first surface, a second surface opposite to the first surface and a plurality of middle conductive pads. The first redistribution circuitry is disposed on the first surface of the middle patterned conductive layer and includes a first patterned conductive layer. The first patterned conductive layer has a plurality of first conductive elements. Each of the first conductive elements has a first conductive pad and a first conductive via that form a T-shaped section. Each of the first conductive via connects the corresponding middle conductive pad and is tapering facing towards the corresponding middle conductive pad. The second redistribution circuitry is disposed on the second surface of the middle patterned conductive layer and includes a second patterned conductive layer. The second patterned conductive layer has a plurality of second conductive elements. Each of the second conductive elements has a second conductive pad and a second conductive via that form an inversed T-shaped section. Each of the second conductive via connects the corresponding middle conductive pad and is tapering facing towards the corresponding middle conductive pad.

The invention provides a manufacturing method of an electronic package. The method includes the following steps. A middle patterned conductive layer is formed. The middle patterned conductive layer has a first surface, a second surface opposite to the first surface and a plurality of middle conductive pads. A first redistribution circuitry is formed on the first surface of the middle patterned conductive layer. The first redistribution circuitry includes a first patterned conductive layer. The first patterned conductive layer has a plurality of first conductive elements. Each of the first conductive elements has a first conductive pad and a first conductive via that form a T-shaped section. Each of the first conductive via connects the corresponding middle conductive pad and is tapering facing towards the corresponding middle conductive pad. A second redistribution circuitry is formed on the second surface of the middle patterned conductive layer. The second redistribution circuitry includes a second patterned conductive layer. The second patterned conductive layer has a plurality of second conductive elements. Each of the second conductive elements has a second conductive pad and a second conductive via that form an inversed T-shaped section. Each of the second conductive via connects the corresponding middle conductive pad and is tapering facing towards the corresponding middle conductive pad.

Based on the above, the electronic package including the first redistribution circuitry and the second redistribution circuitry may be helpful to miniaturization design and simplifying the manufacturing processes. For example, a chip may be mounted on the one side of the electronic package and conductive terminals may be formed on the opposite side of the electronic package. Therefore, comparing with a conventional chip package with a rigid interposer, a thickness of the package with the electronic package may be reduced.

To make the above features and advantages of the present invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1I are schematic cross-sectional views illustrating a manufacturing method of an electronic package according to an embodiment of the invention.

Figure 1A:
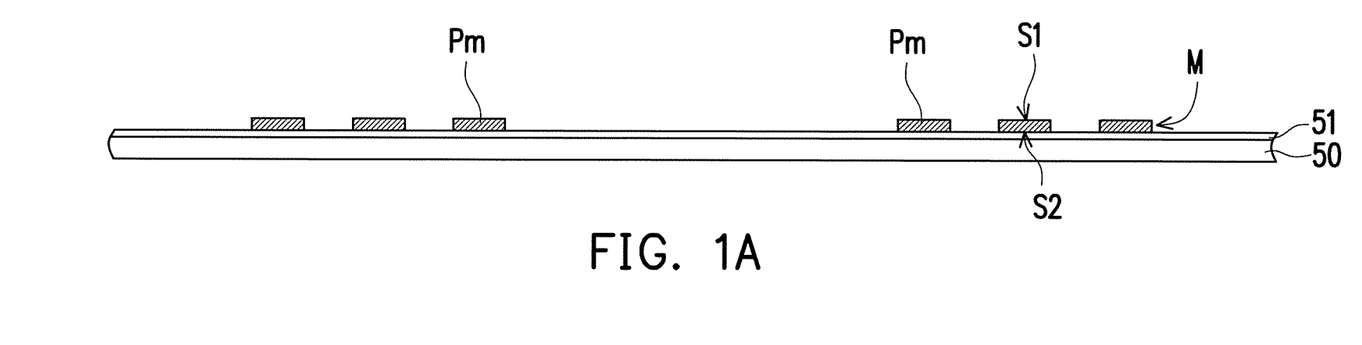
FIG. 1A to FIG. 1I are schematic cross-sectional views illustrating a manufacturing method of an electronic package according to an embodiment of the invention.

Referring to FIG. 1A, a middle patterned conductive layer M is formed on a temporary carrier 50. For example, the middle patterned conductive layer M has a first surface S1, a second surface S2 opposite to the first surface and facing towards the temporary carrier 50 and a plurality of middle conductive pads Pm. In some embodiments, a release layer 51 is applied on a top surface of a temporary carrier 50 to enhance the releasability of the middle patterned conductive layer M from the temporary carrier 50 in the subsequent process. In other words, the second surface S2 of the middle patterned conductive layer M may be temporarily attached to the temporary carrier 50 though the release layer 51. The temporary carrier 50 may be made of glass, plastic or other suitable materials as long the material is able to withstand the subsequent processes while carrying the package structure formed thereon. The release layer 51 may be a LTHC (light to heat conversion) release layer or other suitable release layers.

In some embodiments, the middle conductive pads Pm may include a seed layer (not illustrated) and a metallic layer. For example, the seed layer may be formed on the temporary carrier 50 using a physical vapor deposition (PVD) process, an electroless plating process, a chemical plating process, a thermal evaporation process, a sputtering process or other suitable process. A material of the seed layer may be copper, nickel, or an alloy thereof, but is not limited thereto. Next, a photoresist (not illustrated) may be formed on the seed layer. The photoresist includes a photosensitive resin or other photosensitive materials, but is not limited thereto. The photoresist may be a layer formed by coating and further patterned through exposure and development such that a plurality of openings (not illustrated) may be formed in the photoresist for exposing at least a portion of the seed layer. The metallic layer may be formed in the openings of the photoresist on the seed layer through a plating process. The metallic layer may be formed on the seed layer exposed by the photoresist. A material of the metallic layer may include copper, silver, solder or a combination thereof, but is not limited thereto. Subsequently, the photoresist may be stripped and the seed layer exposed by the metallic layer may be removed using an etching process or other suitable removal process to form the middle conductive pads Pm as shown in FIG. 1A.

Figure 1B:
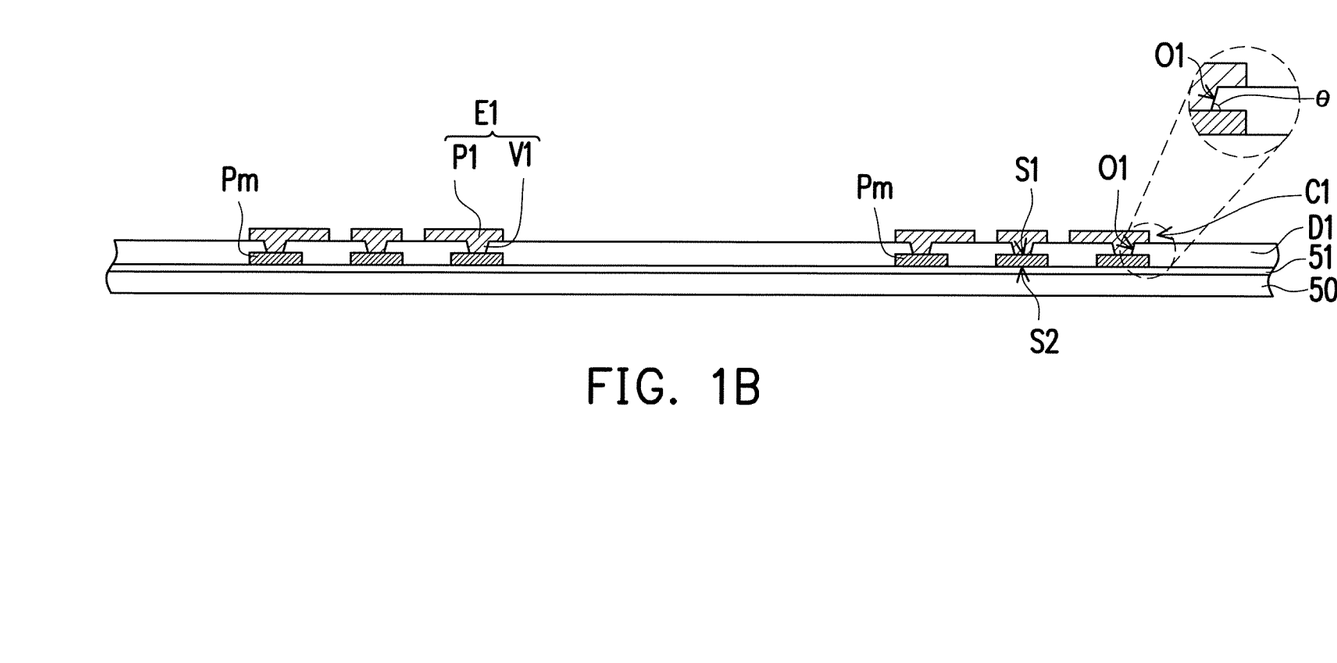
Figure 1C:
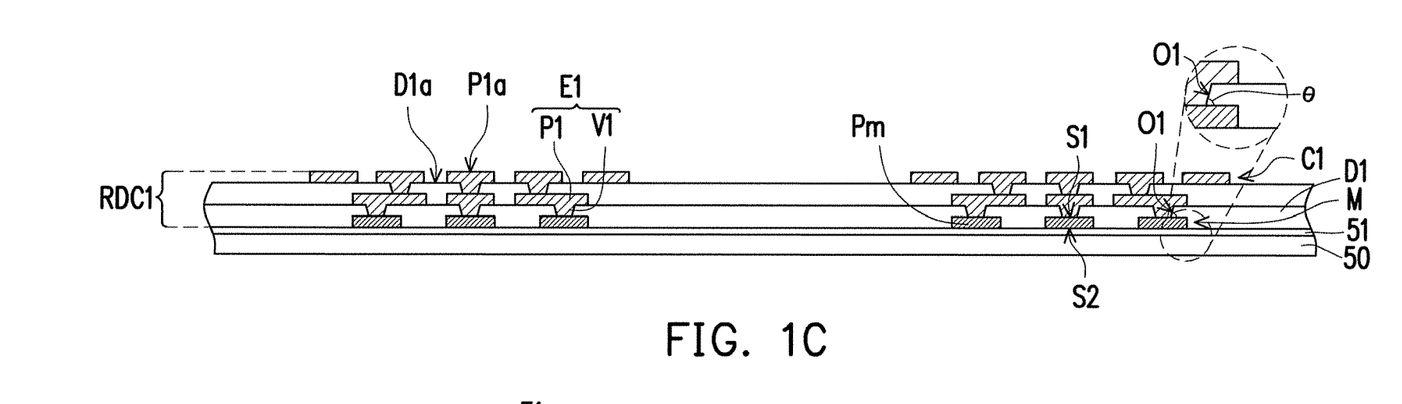

Referring to FIG. 1B and FIG. 1C, a first redistribution circuitry RDC1 is formed on the first surface S1 of the middle patterned conductive layer M. In some embodiments, the first redistribution circuitry RDC1 includes a first patterned conductive layer C1 and a first dielectric layer D1. For example, the first patterned conductive layer C1 has a plurality of first conductive elements E1 electrically connected to the middle patterned conductive layer M. In some embodiments, each of the first conductive elements E1 has a first conductive pad P1 and a first conductive via V1 that form a T-shaped section. For example, each of the first conductive via V1 connects the corresponding middle conductive pad Pm and is tapering facing towards the corresponding middle conductive pad Pm. In other words, the first conductive via V1 has a shape of trapezoid with wide top and narrow bottom in a cross-sectional view.

In some embodiments, a dielectric material (not illustrated) is formed over the temporary carrier 50 to cover the middle patterned conductive layer M, and then the dielectric material may be patterned, for example, by removing a portion of the dielectric material to form the first dielectric layer D1 using, for example, a photolithography and an etching process. As such, the first dielectric layer D1 may include a plurality of openings O1 exposing at least the portion of the middle conductive pads Pm for further electrical connection. In other words, the middle patterned conductive layer M is embedded in the first dielectric layer D1 and a portion of the first surface S1 and the entire of the second surface S2 of the middle patterned conductive layer M are exposed from the first dielectric layer D1. For example, the dielectric material may include non-organic or organic dielectric materials such as polyimide, silicon oxide, benezocyclobutene (BCB), or the like, but is not limited thereto. In some embodiments, the openings O1 have a tapered sidewall. In other word, an angle θ may be between the sidewall of the first dielectric layer D1 and the first surface S1 of the middle patterned conductive layer M in the cross-sectional view. The angle θ may include acute angle depending on the design requirement.

Subsequently, the first patterned conductive layer C1 is formed in the openings O1 and on the first dielectric layer D1 to electrically connect the middle conductive pads Pm. For example, the portion of the first patterned conductive layer C1 forming in the openings O1 may be referred as the first conductive via V1 and the portion of the first patterned conductive layer C1 forming on the first dielectric layer D1 and connected to the first conductive via V1 may be referred as the first conductive pad P1. In other words, the first conductive pad P1 of the first patterned conductive layer C1 is disposed on the first dielectric layer D1 and the first conductive vias V1 pass through the first dielectric layer D1. The first conductive via V1 and the first conductive pad P1 of the first patterned conductive layer C1 may be formed in the same process using, for example, a deposition process or a plating process. A material of the first patterned conductive layer C1 may include copper, gold, silver, solder or a combination thereof, but is not limited thereto.

In some embodiments, the abovementioned steps may be performed multiple times to obtain a multi-layered redistribution circuitry as required by the circuit design as shown in FIG. 1C. In other words, the first redistribution circuitry RDC1 may include a plurality of the first patterned conductive layers C1 and a plurality of the first dielectric layers D1 stacked alternately. In some embodiments, the topmost first dielectric layer D1 may have openings exposing at least the portion of the topmost first patterned conductive layer C1. In some other embodiments, a topmost surface P1a of the first conductive pad P1 of the first patterned conductive layer C1 may be protruded from a topmost surface D1a of the first dielectric layer D1 as shown in FIG. 1C.

Figure 1D:
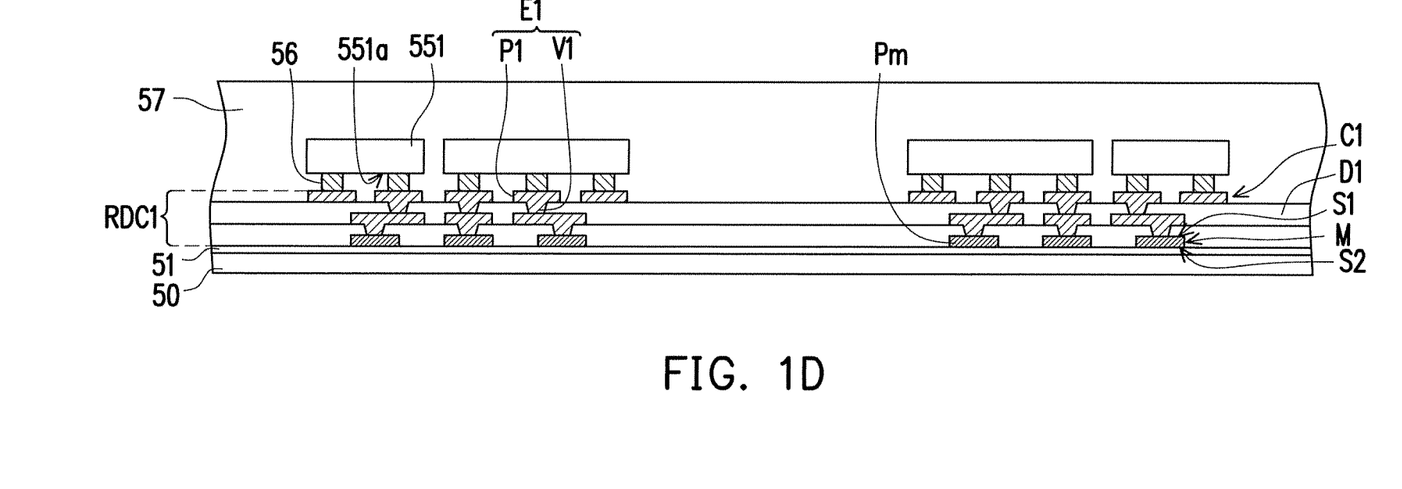
Figure 1E:
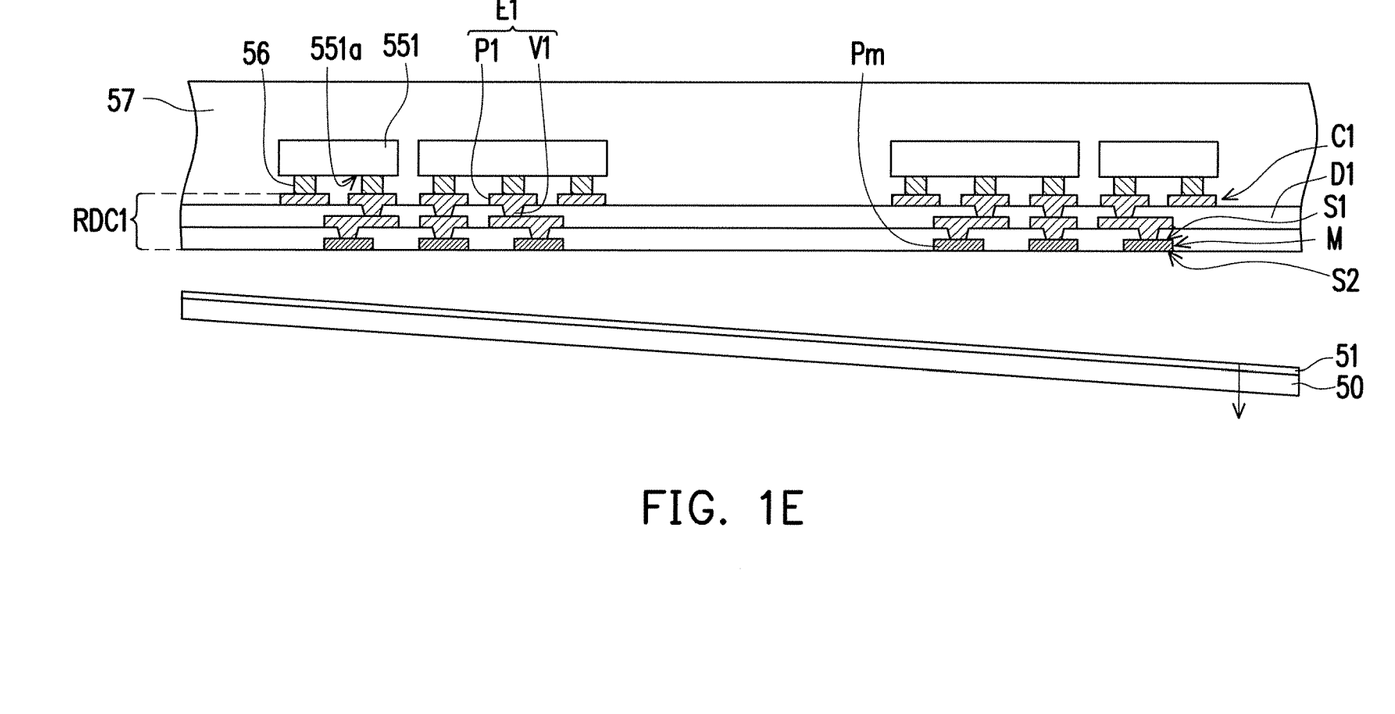

Referring to FIG. 1D and FIG. 1E, a chip 551 is disposed on the first redistribution circuitry RDC1 using, for example, the flip-chip bonding. In some embodiments, more than one chip with the same or different functions can be disposed on the first redistribution circuitry RDC1. In such case, multiple chips 551 may be electrically connected to each other through the first redistribution circuitry RDC1. The amount of the chip disposed on the first redistribution circuitry RDC1 construes no limitation in the disclosure. For example, the chip 551 has an active surface 551a facing towards the first redistribution circuitry RDC1 and a plurality of conductive pillars 56 on the active surface 551a. The conductive pillars 56 of the chip 551 are electrically connected to the first redistribution circuitry RDC1 and the middle patterned conductive layer M. For example, the conductive pillars 56 are plated copper pillars or other suitable metallic pillars. In some embodiments, an underfill (not illustrated) may be formed on the first redistribution circuitry RDC1 to fill the gap between the first redistribution circuitry RDC1 and the chip 511 so as to enhance the reliability of the chip-disposing process.

Subsequently, an encapsulant 57 is formed on the first redistribution circuitry RDC1 to encapsulate the chip 511. In some embodiments, the encapsulant 57 may be a molding compound formed by a molding process. After forming the encapsulant 57, the temporary carrier 50 may be removed from the middle patterned conductive layer M and the first redistribution circuitry RDC1 to expose the second surface S2 of the middle patterned conductive layer M. For example, the external energy such as UV laser, visible light or heat, may be applied to the release layer 51 so that the first dielectric layer D1 and the middle patterned conductive layer M may be peeled off from the temporary carrier 50. Based on the formation of the encapsulant 57, the semi-product has rigidness enough to keep the second surface S2 of the middle patterned conductive layer M flat and without having wrinkles thereon, so that subsequent forming processes can be well performed on the second surface S2 of the middle patterned conductive layer M.

Figure 1F:
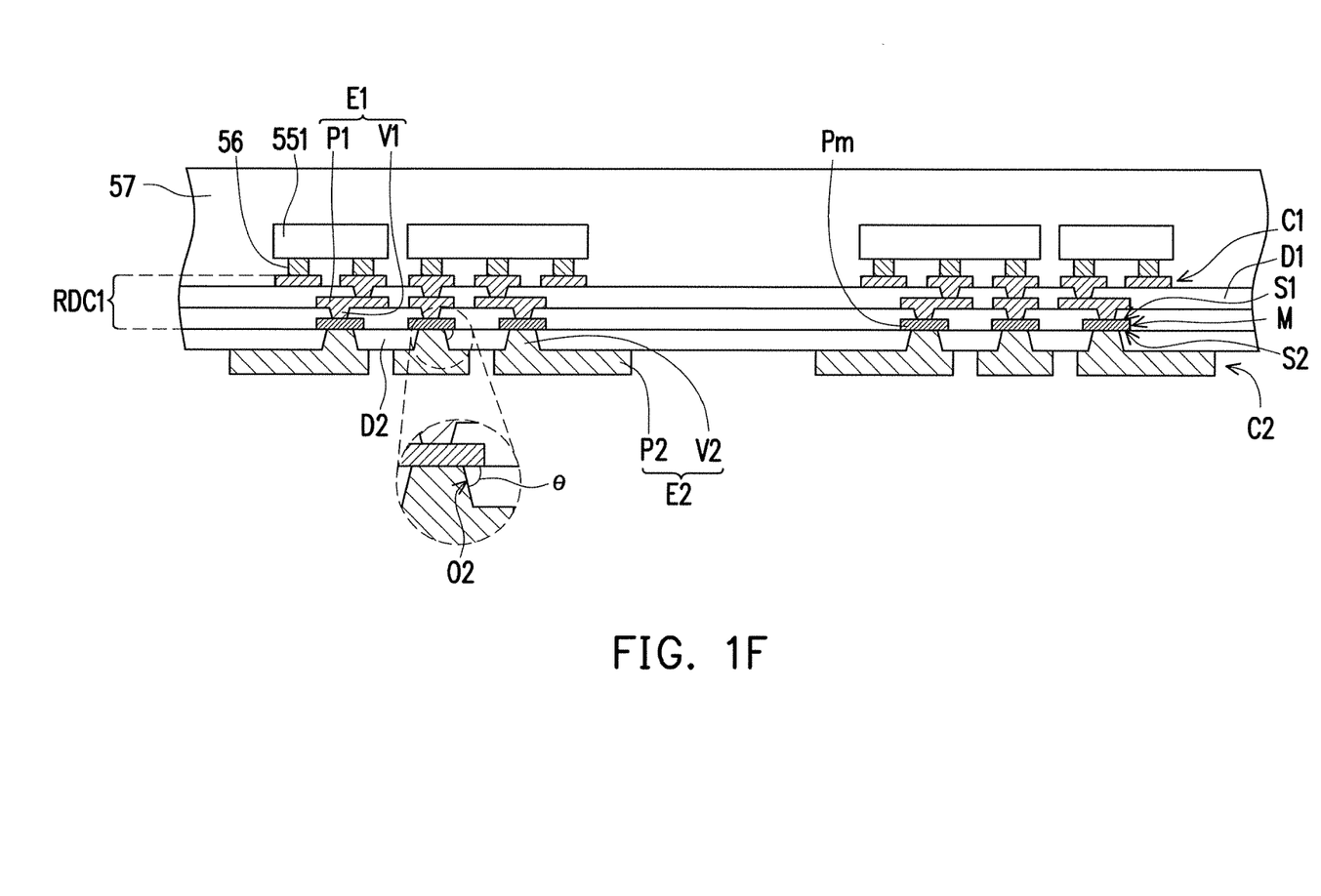
Figure 1G:
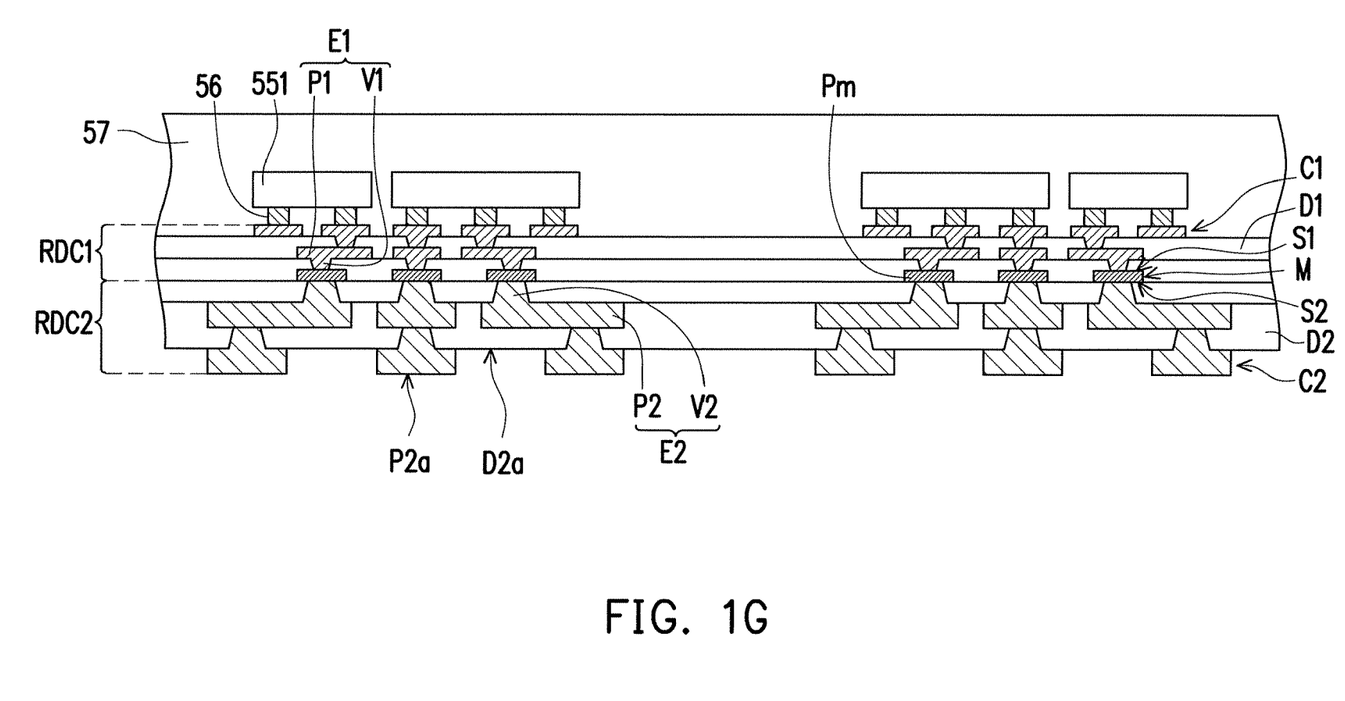

Referring to FIG. 1F and FIG. 1G, a second redistribution circuitry RDC2 is formed on the second surface S2 of the middle patterned conductive layer M. In other words, the second redistribution circuitry RDC2 is electrically connected to the chip 551 through the middle patterned conductive layer M and the first patterned conductive layer C1 of the first redistribution circuitry RDC1. The second redistribution circuitry RDC2 includes a second patterned conductive layer C2 and a second dielectric layer D2 partially covering the middle patterned conductive pads Pm. For example, the second patterned conductive layer C2 has a plurality of second conductive elements E2 electrically connected to the middle patterned conductive pads Pm. In some embodiments, each of the second conductive elements E2 has a second conductive pad P2 and a second conductive via V2 that form an inversed T-shaped section. For example, each of the second conductive via V2 connects the corresponding middle conductive pad Pm and is tapering facing towards the corresponding middle conductive pad Pm. In other words, the second conductive via V2 has a shape of inverted trapezoid with bottom wide and top narrow relative to the second surface S2 of the middle patterned conductive layer M in a cross-sectional view.

The forming process of the second redistribution circuitry RDC2 may be similar with the first redistribution circuitry RDC1 and the detailed descriptions are simplified. In some embodiments, after removing the temporary carrier 50, the encapsulant 57 may be flipped upside down such that the second surface S2 of the middle patterned conductive layer M faces upward to perform the forming process of the second redistribution circuitry RDC2.

For example, a dielectric material (not illustrated) may be formed over the middle patterned conductive layer M and the first dielectric layer D1, and then the dielectric material is patterned, for example, by removing a portion of the dielectric material to form the second dielectric layer D2. As such, the second dielectric layer D2 may have a plurality of openings O2 exposing at least the portion of the middle patterned conductive pads Pm for further electrical connection. In other words, the second dielectric layer D2 covers the second surface S2 of the middle patterned conductive layer M and the openings O2 of the second dielectric layer D2 exposes the second surface S2 of the middle patterned conductive layer S2.

Subsequently, the second patterned conductive layer C2 is formed in the openings O2 and on the second dielectric layer D2. For example, the portion of the second patterned conductive layer C2 forming in the openings O2 may be referred as the second conductive via V2 and the portion of the second patterned conductive layer C2 forming on the second dielectric layer D2 and connected to the second conductive via V2 may be referred as the second conductive pad P2. In other words, the second conductive pad P2 of the second patterned conductive layer C2 is disposed on the second dielectric layer D2 and the second conductive vias V2 pass through the second dielectric layer D2. The material of the second patterned conductive layer C2 may be similar with the first patterned conductive layer C1 and the detailed descriptions are omitted herein. In some embodiments, the openings O2 of the second dielectric layer D2, similar with the openings O1 of the first dielectric layer D1, may have a tapered sidewall. In other word, the angle θ may be between the sidewall of the second dielectric layer D2 and the second surface S2 of the middle patterned conductive layer M.

In some embodiments, the abovementioned steps may be performed multiple times to obtain a multi-layered redistribution circuitry as required by the circuit design as shown in FIG. 1G. In other words, the second redistribution circuitry RDC2 may include a plurality of the second patterned conductive layers C2 and a plurality of the second dielectric layers D2 stacked alternately. In some embodiments, the bottommost second dielectric layer D2 may have openings O2 exposing at least the portion of the bottommost second patterned conductive layer C2 relative to the middle patterned conductive layer M. In some other embodiments, a bottommost surface P2a of the second conductive pad P2 of the second patterned conductive layer C2 may be protruded from a bottommost surface D2a of the first dielectric layer D2 as shown in FIG. 1F. In some embodiments, the first redistribution circuitry RDC1 electrically connected to the second redistribution circuitry RDC2 is referred as a fan-out configuration. For example, the fan-out configuration refers to a structure in which the rerouting pattern (e.g. the first patterned conductive layer C1 and the second patterned conductive layer C2) are rearranged to be expanded wider than the size of the chip 551 in order to connecting the external terminals.

Figure 1H:
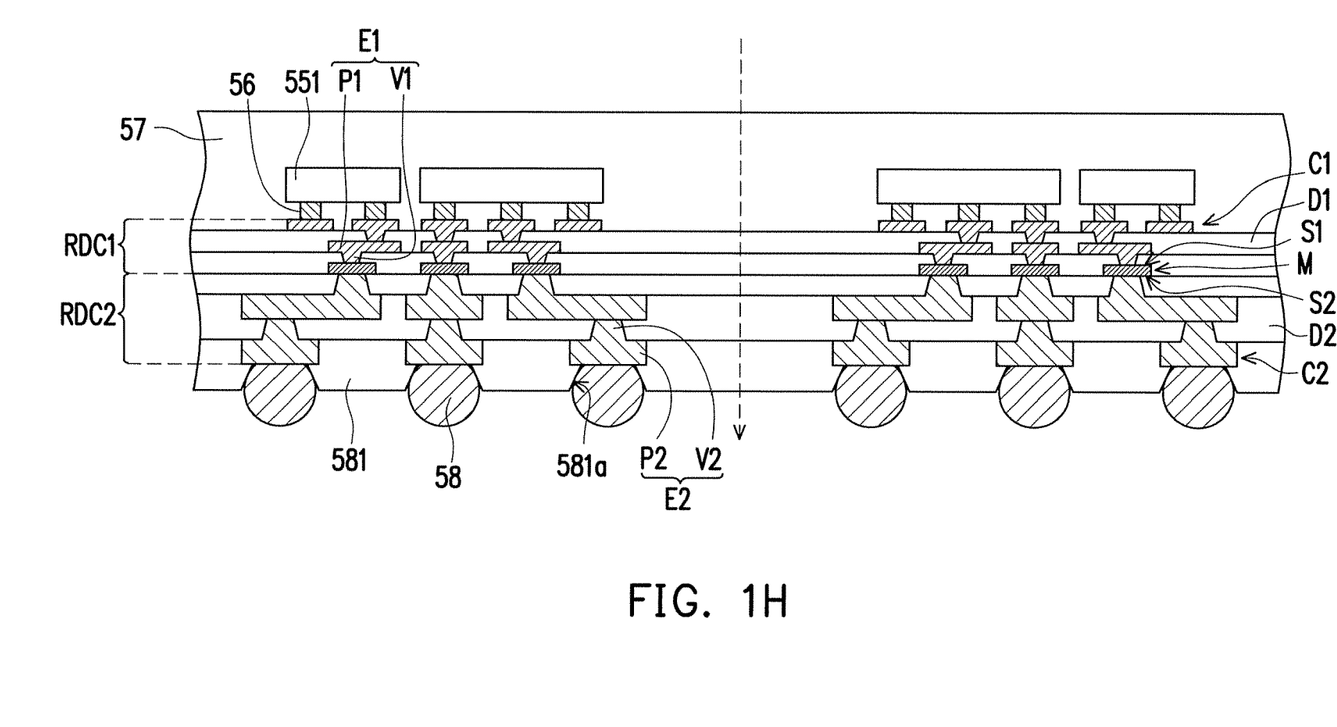

Referring to FIG. 1H, a plurality of conductive terminals 58 is formed on the second redistribution circuitry RDC2 and electrically connected to the second patterned conductive layer C2, the middle patterned conductive layer M and the first patterned conductive layer C1 of the first redistribution circuitry RDC1. For example, the conductive terminals 58 may be solder balls.

In some embodiments, a passivation layer 581 including a plurality of openings 581a may be first formed on the second redistribution circuitry RDC2 opposite to the middle patterned conductive layer M using, for example, photolithography and etching processes. For example, the openings 581a expose a portion of the second patterned conductive layer C2 of the second redistribution circuitry RDC2, and the conductive terminals 58 are disposed corresponding to the openings 581a. In some embodiments, the passivation layer 581 may serve as a solder resist layer. Subsequently, the conductive terminals 58 are formed corresponding to the openings 581a of the passivation layer 581 using, for example, a ball placement process. Moreover, a soldering process and a reflowing process are optionally performed for enhancement of the adhesion between the conductive terminals 58 and the second redistribution circuitry RDC2.

Figure 1I:
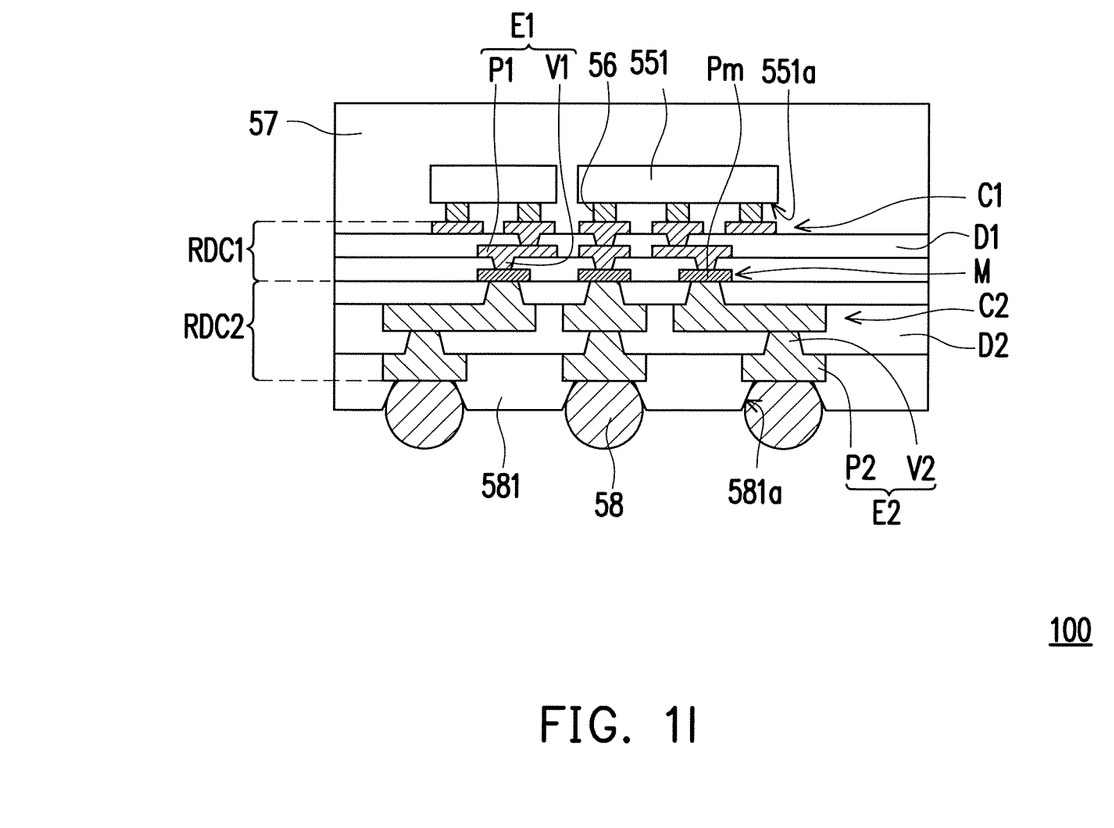

Referring to FIG. 1I, after forming the conductive terminals 58, the singulation process may be performed to form a chip package 100. Since the conventional interposer is unnecessary to be included in the chip package 100, the overall thickness of the chip package 100 is reduced.

Figure 2A:
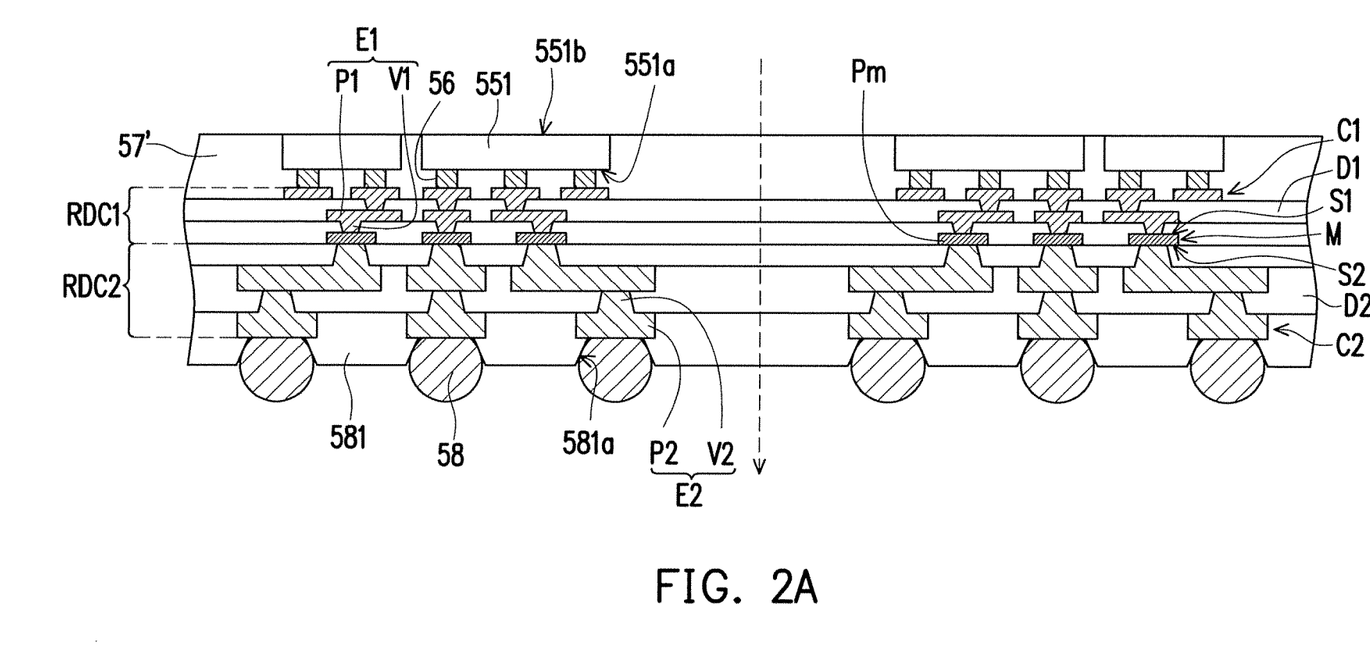
FIG. 2A and FIG. 2B are schematic cross-sectional views illustrating a manufacturing method of an electronic package according to an embodiment of the invention.
Figure 2B:
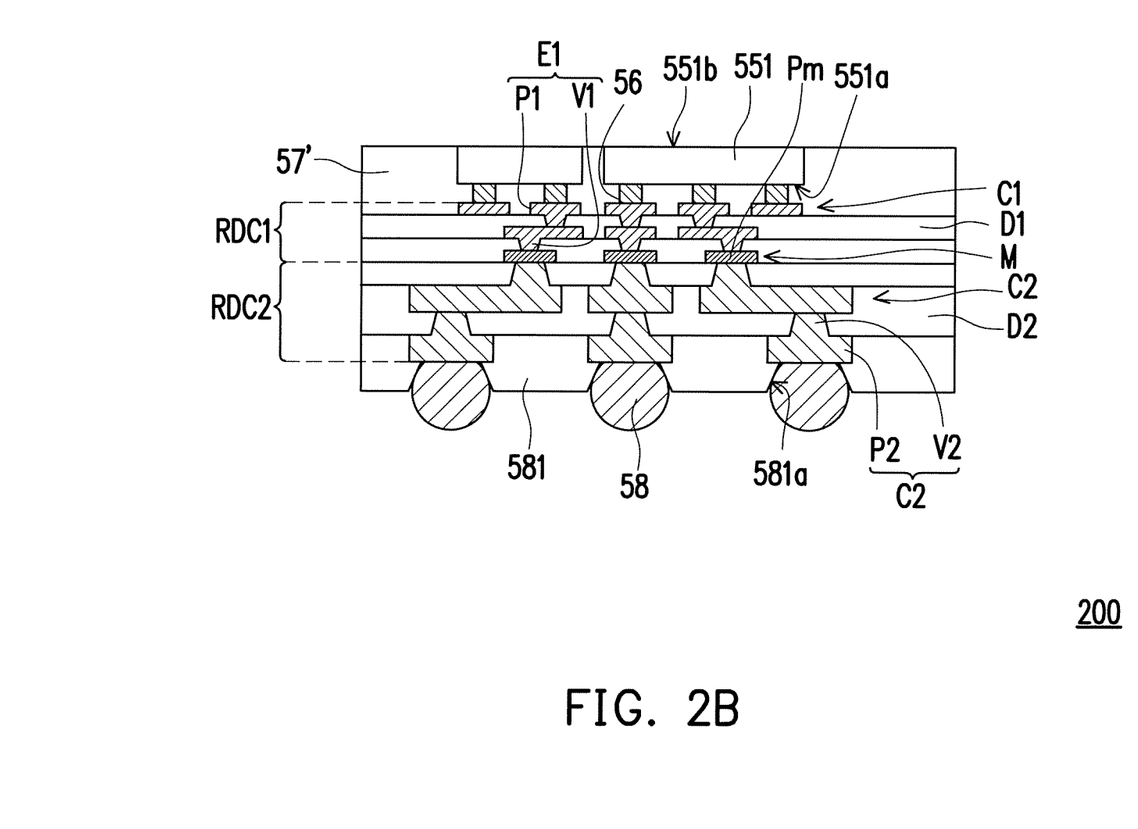

FIG. 2A and FIG. 2B are schematic cross-sectional views illustrating a manufacturing method of an electronic package according to an embodiment of the invention. The manufacturing method of the present embodiment is similar to the embodiments illustrated in FIG. 1A to FIG. 1I. The identical or similar numbers refer to the identical or similar elements throughout the drawings, and detail thereof is not repeated. The difference between the present embodiment and the abovementioned embodiment in FIG. 1A to FIG. 1I lies in that part of the molding compound 57 can be removed from top to thin the chip package before singulating.

Referring to FIG. 2A, a thinning process (e.g. a grinding process, a polishing process, or other suitable process) may be performed on the encapsulant 57 to reduce the thickness thereof after forming the conductive terminals 58. In some embodiments, after performing the thinning process, the encapsulant 57' may expose a back surface 551b of the chip 551 opposite to the active surface 551a. In some other embodiments, a portion of the chip 551 may be removed with the encapsulant 57' in the thinning process. For example, after performing the thinning process, the back surface 551b of the chip 551 is substantially coplanar with the top surface of the encapsulant 57'.

Referring to FIG. 2B, after performing the thinning process, the singulation process may be performed to form a chip package 200. Since the conventional interposer is unnecessary to be included in the chip package 200 and a portion of the encapsulant 57' is removed, the overall thickness of the chip package 200 is further reduced, thereby miniaturizing the chip package while maintaining the process simplicity.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic package, comprising:
   a middle patterned conductive layer having a first surface, a second surface opposite to the first surface and a plurality of middle conductive pads;
   a first redistribution circuitry disposed on the first surface of the middle patterned conductive layer and comprising a first patterned conductive layer, wherein the first patterned conductive layer has a plurality of first conductive elements, each of the first conductive elements has a first conductive pad and a first conductive via that form a T-shaped section, and each of the first conductive via connects the corresponding middle conductive pad and is tapering facing towards the corresponding middle conductive pad; and
   a second redistribution circuitry disposed on the second surface of the middle patterned conductive layer and comprising a second patterned conductive layer, wherein the second patterned conductive layer has a plurality of second conductive elements, each of the second conductive elements has a second conductive pad and a second conductive via that form an inversed T-shaped section, and each of the second conductive via connects the corresponding middle conductive pad and is tapering facing towards the corresponding middle conductive pad.

2. The electronic package according to claim 1, further comprising:
   a chip disposed on the first redistribution circuitry.

3. The electronic package according to claim 2, wherein the chip has an active surface and a plurality of conductive pillars on the active surface, and the conductive pillars of the chip are connected to the first redistribution circuitry.

4. The electronic package according to claim 2, further comprising:
   an encapsulant disposed on the first redistribution circuitry and encapsulating the chip.

5. The electronic package according to claim 4, wherein the encapsulant exposes a back surface of the chip opposite to the active surface.

6. The electronic package according to claim 1, wherein the first redistribution circuitry comprises a first dielectric layer, the middle patterned conductive layer is embedded in the first dielectric layer, and a portion of the first surface and the entire of the second surface of the middle patterned conductive layer are exposed from the first dielectric layer.

7. The electronic package according to claim 6, wherein the first patterned conductive layer is disposed on the first dielectric layer and the first conductive vias pass through the first dielectric layer.

8. The electronic package according to claim 1, wherein the second redistribution circuitry comprises a second dielectric layer covering the second surface of the middle patterned conductive layer and exposing the second surface of the middle patterned conductive layer.

9. The electronic package according to claim 8, wherein the second patterned conductive layer is disposed on the second dielectric layer and the second conductive vias pass through the second dielectric layer.

10. The electronic package according to claim 1, further comprising:
    a plurality of conductive terminals disposed on the second redistribution circuitry.

11. The electronic package according to claim 10, further comprising:
    a passivation layer disposed on the second redistribution circuitry opposite to the middle patterned conductive layer, wherein the passivation layer has a plurality of openings exposing a portion of the second redistribution circuitry and the conductive terminals are disposed corresponding to the openings.

* * * * *